United States Patent
Duan et al.

(10) Patent No.: US 8,482,943 B2
(45) Date of Patent: Jul. 9, 2013

(54) POWER TRANSISTOR DRIVING CIRCUITS AND METHODS FOR SWITCHING MODE POWER SUPPLIES

(75) Inventors: Jianhua Duan, Shanghai (CN); Qiang Zong, Shanghai (CN); Yajiang Zhu, Shanghai (CN)

(73) Assignee: BCD Semiconductor Manufacturing Limited, Grand Cayman (KY)

( * ) Notice: Subject to any disclaimer, the term of this patent is extended or adjusted under 35 U.S.C. 154(b) by 804 days.

(21) Appl. No.: 12/638,809

(22) Filed: Dec. 15, 2009

(65) Prior Publication Data

US 2011/0122659 A1    May 26, 2011

(30) Foreign Application Priority Data

Nov. 20, 2009   (CN) .......................... 2009 1 0226104

(51) Int. Cl.
*H02M 1/12* (2006.01)
*H02M 3/335* (2006.01)

(52) U.S. Cl.
USPC ........................................ 363/40; 363/21.01

(58) Field of Classification Search
USPC ................................ 363/21.01–21.18, 39–41
See application file for complete search history.

(56) References Cited

U.S. PATENT DOCUMENTS

| | | | |
|---|---|---|---|
| 7,760,520 B2 * | 7/2010 | Jang et al. | 363/21.18 |
| 8,018,743 B2 * | 9/2011 | Wang et al. | 363/21.18 |
| 8,125,799 B2 * | 2/2012 | Zhu et al. | 363/21.14 |
| 8,344,659 B2 * | 1/2013 | Shimomura et al. | 315/307 |

* cited by examiner

*Primary Examiner* — Jessica Han
(74) *Attorney, Agent, or Firm* — Kilpatrick Townsend & Stockton LLP

(57) ABSTRACT

A power supply controller is provided for providing a drive current to a control terminal of a power transistor in three time intervals. The controller includes control circuits configured to control the drive current in multiple stages. During a first time interval, first drive current includes a current spike for turning on the power transistor in response to a start of the control signal pulse. During a second time interval, a second drive current includes a ramping current substantially proportional to a magnitude of a current through the power transistor. During a third time interval, current flow to the power transistor is at least partially turned off before an end of the control signal pulse.

20 Claims, 10 Drawing Sheets

POWER TRANSISTOR DRIVING CIRCUITS AND METHODS FOR SWITCHING MODE POWER SUPPLIES

CROSS-REFERENCES TO RELATED APPLICATIONS

This application claims priority to Chinese Patent Application No. 200910226104.3, filed Nov. 20, 2009 by inventors Jianhua Duan et. al., commonly assigned and incorporated in its entirety by reference herein for all purposes.

BACKGROUND OF THE INVENTION

Embodiments of the present invention are directed to power supply control circuits and power supply systems. More particularly, embodiments of the present invention provides methods and circuits for controlling a power transistor in a switching mode power supply (SMPS).

Regulated power supplies are indispensable in modern electronics. For example, the power supply in a personal computer often needs to receive power input from various outlets. Desktop and laptop computers often have regulated power supplies on the motherboard to supply power to the CPU, memories, and periphery circuitry. Regulated power supplies are also used in a wide variety of applications, such as home appliances, automobiles, and portable chargers for mobile electronic devices, etc.

In general, a power supply can be regulated using a linear regulator or a switching mode controller. A linear regulator maintains the desired output voltage by dissipating excess power. In contrast, a switching mode controller rapidly switches a power transistor on and off with a variable duty cycle or variable frequency and provides an average output that is the desired output voltage.

Compared with linear regulators, switching mode power supplies have the advantages of smaller size, higher efficiency and larger output power capability. On the other hand, they also have the disadvantages of greater noise, especially Electromagnetic Interference at the power transistor's switching frequency or its harmonics.

Pulse Width Modulation (PWM) and Pulse Frequency Modulation (PFM) are two control architectures of switching mode power supplies. In recent years, green power supplies are emphasized, which require higher conversion efficiency and lower standby power consumption. In a PWM controlled switching mode power supply, the system can be forced to enter into burst mode in standby conditions to reduce power consumption. In a PFM controlled switching mode power supply, the switching frequency can be reduced in light load conditions. PFM-controlled switching mode power supply exhibits simple control topology and small quiescent current. Therefore, it is suitable for low cost small output power applications such as battery chargers and adapters.

In such a switched mode power supply system, a switch is connected to the primary winding of the transformer. In the switching power supplies, the power transistor switch on and off periodically to convert the primary current of the transformer to the secondary side. The stable output voltage will be obtained by regulating the duty cycle or frequency of the primary side switch. Magnetic energy is stored in the inductance of the primary winding when the switch is turned on, and the energy is transferred to the secondary winding when the switch is turned off. The energy transfer results in a current flowing through the secondary winding and the rectifying diode. When the energy transfer is completed, i.e., the current stops flowing through the diode, a substantially sinusoidal oscillation of decreasing amplitude appears at the secondary winding.

The frequency of the sinusoidal oscillation is determined, in part, by the inductance of the primary winding and by the parasitic capacitance in the primary winding as well in the printed circuit board. The effect of these components often are difficulty to determine in advance and can lead to output performance limitations in the switched mode power supply. Some of these limitations are described in more detail below.

Therefore, there is a need for techniques that can provide more effective control of the power transistor in a switching mode power supply.

BRIEF SUMMARY OF THE INVENTION

Embodiments of the present invention provides methods and circuits for controlling a power transistor in a switching mode power supply (SMPS). In a specific embodiment, a method and circuits is provided for multi-stage turn on and turn off the power transistor to achieve reduced switching loss and better conversion efficiency. But it would be recognized that the invention has a much broader range of applicability.

In an embodiment, a power supply controller is provided for providing a drive current to a control terminal of a power transistor in three time intervals. The controller includes control circuits configured to control the drive current in multiple stages:
  during a first time interval, provide a first drive current that includes a current spike for turning on the power transistor in response to a start of the control signal pulse;
  during a second time interval, provide a second drive current that includes a ramping current substantially proportional to a magnitude of a current through the power transistor; and
  during a third time interval, at least partially turn off current flow to the power transistor before an end of the control signal pulse.

In some embodiments, the power transistor is first turned on by an initial overdrive current, and the overdrive current is further increased by mirroring an leading edge current spike in a feedback signal representing the primary winding current. After the termination of the overdrive stage, the drive current is increased proportionally with the increase of the primary winding current during the primary winding on time. When the primary winding current reaches a pre-determined level, the main driving current is cutoff for a time period. In an embodiment, this cutoff time period is selected based on a storage time of the power transistor.

In some embodiments, when it is time to cut off the remaining forward driving current, the power transistor turn off stage starts with the discharge of storage charges rapidly by overdriving a discharge transistor coupled to the power transistor. And after the initial discharge of the storage charge, a moderate Rdson of the discharge transistor is maintained. In this way, a large reverse current is generated to provide a rapid turn-off of the power transistor. As a result, lower switching loss is achieved. More details of these embodiments are described below in the context of a bipolar power transistor.

In another embodiment, a method is provided for short circuit protection of the power supply, which could be damaged if the current sensing circuit on the primary side malfunctions. For example, if the current sense resistor is shorted or is changed to a lower value, a large current may flow in the power supply circuit. In embodiments of the invention, with the multistage turn-on methods, the power transistor is only turned on by the initial overdrive current. And virtually no further base drive current is generated due to the lower voltage on the current sense resistor, so the power transistor will turn on for a short period of time and then be cut off. In this embodiment, the primary current is prevented from continuing to increase indefinitely, thus ensuring the safety of the power transistor and the whole system. This method is more reliable and efficient compared with conventional driving methods.

Another embodiment provides a driver circuit for turning off a bipolar transistor. The driver circuit includes a current mirror having first and second PMOS transistors coupled to a first voltage during a first time period, a bipolar transistor coupled to the current mirror, and a plurality of diode devices coupled between a collector and a base of the bipolar transistor. The driver circuit also has an MOS transistor having a gate terminal coupled to the collector of the bipolar transistor and a drain terminal for coupling to a control terminal of the bipolar transistor for turning off the power transistor.

Another embodiment provides a method for driving a bipolar power transistor. The method includes, during a first time period, turning on the power transistor with an initial drive current, and increasing the drive current with a current related to a leading edge current spike on a current sense resistor, and maintaining current flow in the power transistor with a ramping drive current. The method also includes, during a second time period, turning off the drive current while allowing current flow in the power transistor to continue.

According to another embodiment, a method for turning off a bipolar transistor includes coupling an MOS transistor to a base of the bipolar transistor. During a first time period, the method includes applying a first voltage to a gate of the MOS transistor to discharge the bipolar transistor. During a second time period, the method includes applying a second voltage to the gate of the MOS transistor, the second voltage being lower than the first voltage.

Another embodiment provides a switching mode power supply (SMPS) that includes a primary winding, a power transistor coupled to the primary winding, and an auxiliary winding for providing a feedback signal, which is related to a current flow through the primary winding. The SMPS also has a power supply controller for providing a drive current to a control terminal of a power transistor in three time intervals. Depending on the embodiment, the controller can have one or more of the various features described above.

These and other features and advantages of embodiments of the present invention will be more fully understood and appreciated upon consideration of the detailed description of the preferred implementations of the embodiments, in conjunction with the following drawings.

DETAILED DESCRIPTION OF THE INVENTION

Figure 1:
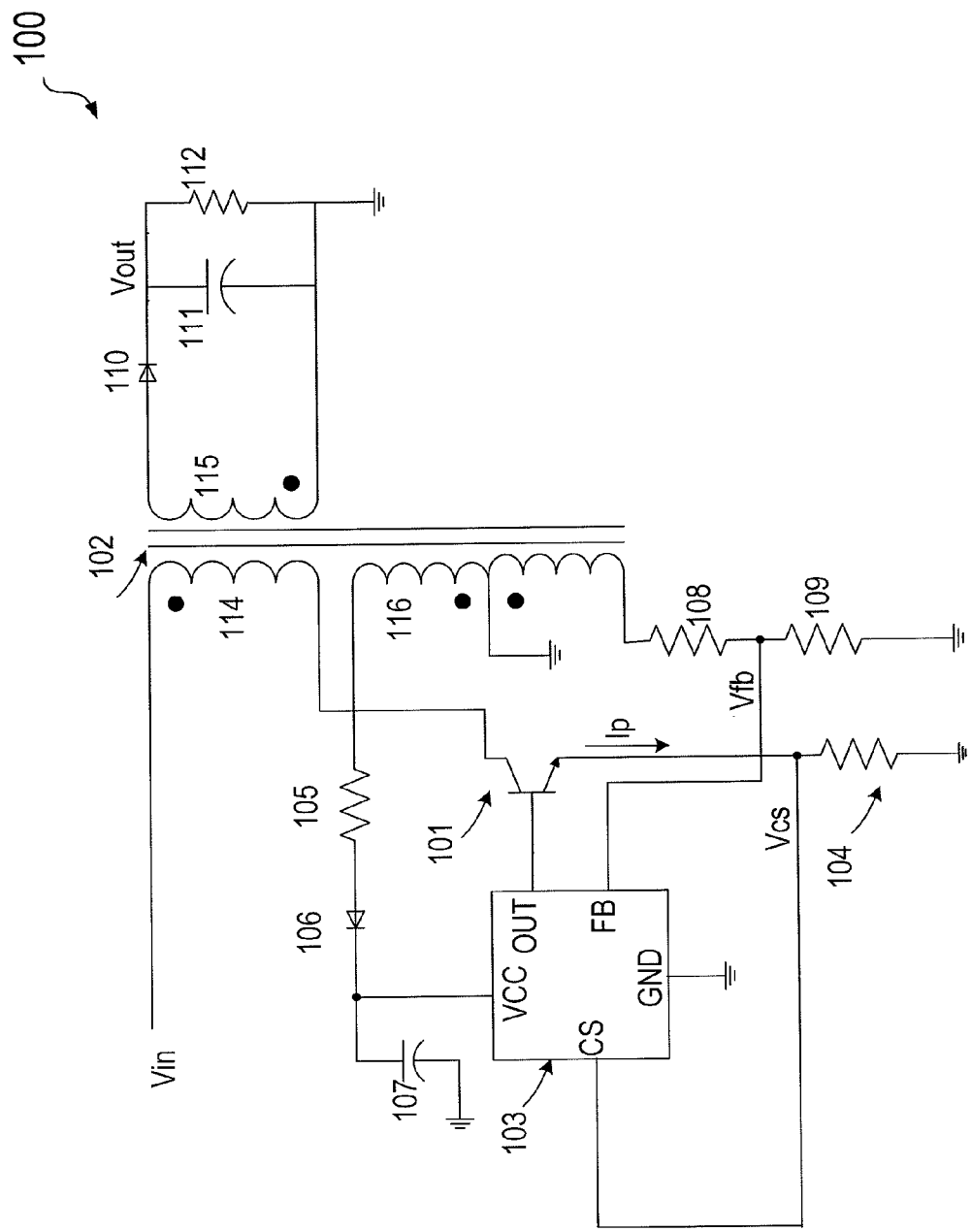
FIG. 1 is a schematic diagram illustrating a conventional switching mode power supply system.

FIG. 1 is a schematic diagram illustrating a conventional switching mode power supply system (SMPS) 100. As shown, SMPS 100 is a flyback-type primary side regulated switched mode power supply using a pulse frequency modulation (PFM) control. The primary side regulated switched mode power supply includes a rectifier and capacitor (not shown) that converts an AC mains voltage to an unregulated voltage Vin, which is then applied to a terminal of a primary winding 114 of a transformer 102. Primary winding 114 is also coupled to a high voltage NPN power transistor 101, which is turned on and off by a signal OUT of a power supply controller 103. When transistor 101 is turned on, a primary current Ip flows through primary winding 114, which starts to build up a magnetic energy. A secondary winding 115 is magnetically coupled to primary winding 114. When transistor 101 is turned on, the magnetic field produced by a primary current Ip induces a voltage in secondary winding 115. When transistor 101 is turned off, a secondary current is induced in secondary winding 115. The secondary current charges up capacitor 111 through a diode 110 and provides an output voltage Vout to a load 112. When the energy in the magnetic field is completely discharged, capacitor 111 maintains an output current flowing in load 112 by partly discharging after the secondary current stops flowing.

As shown in FIG. 1, SMPS 100 can include one or more auxiliary windings 116, which provides operating power VCC to controller 103 through a circuit that includes resistor 105, diode 106, and capacitor 107. Auxiliary winding 116 also provides a feedback voltage signal Vfb to an FB terminal of controller 103 through resistors 108 and 109. Feedback signal Vfb is used by controller 103 as a measure of output voltage Vout of the power supply in order to regulate the output voltage.

When transistor 101 is turned on, primary current Ip through a current sensing resistor 104, which provides a current sense voltage Vcs to a CS terminal of controller 103. Current sense signal Vcs is used to for controlling current flow in the primary winding. For example, transistor 101 is turned off, if Vcs reaches a predetermined value.

Even though in wide use, conventional power supplies such as SMPS 100 suffer from many limitations. For example, the power transistor employed in the power supply system has a switching frequency limit, in part, due to the time required to fully turn on or turn off the power transistor.

Another problem can arise when current sense resistor 104 is improperly selected or malfunctions. As described above, the switch-on time can be controlled by current sense voltage Vcs. When voltage Vcs reaches a pre-determined voltage level, switch 101 is turned off. However, if the current sense resistor is shorted or changed to a lower value, the sense voltage may not reach the target level. Then the switch control signal may stay at the on state, and the base drive current would continue to flow through the power transistor. In this case, the primary side current will continue to increase, and the power transistor or other components maybe damaged due to over heating. The problems described above can be further appreciated with the waveforms in FIG. 2.

Figure 2:
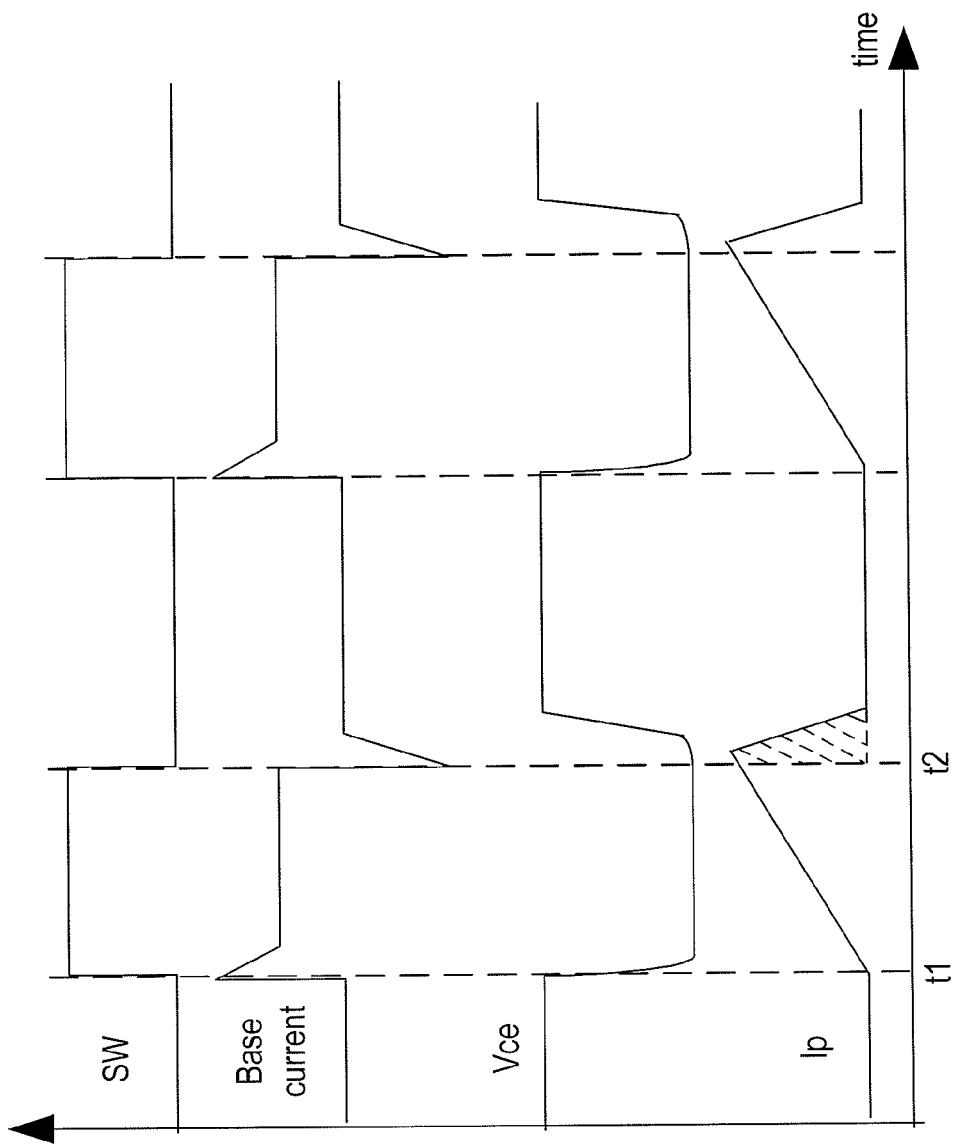
FIG. 2 is a timing diagram illustrating signal waveforms in a conventional switching mode power supply system.

FIG. 2 is a timing diagram illustrating waveforms of signals in switching mode power supply system 100 of FIG. 1, and includes the following signals:

"SW" is a power control signal pulse provided by controller 103;

"Base current" is the current provided to the base terminal of power transistor 101;

"Vce" is the collector-emitter voltage of power transistor 101; and

"Ip" is the current flowing through power transistor 101 and primary winding 114.

As shown by the "Base current" waveform in FIG. 2, at time t1, when switch control signal (SW) turns to a high voltage level, a forward base drive current is applied with an overdrive current followed by a constant driving current. At time t2, when the primary winding current Ip reaches a pre-determined value, the forward base drive current is cut off. However, as shown in the "Ip" waveform, primary current Ip continues to flow due to stored charges, as indicated by the shaded area under waveform Ip. As a result, the response of the power supply to the control signal can be slowed, and the switching frequency can be limited.

Accordingly, there is a need for methods and circuits for more effectively controlling the power transistor in a power supply.

Embodiments of the present invention provides a power supply controller that includes faster turn on of the power transistor and a discharge circuit having a low resistance path for discharging the storage charge of the power transistor. Some examples are described below.

Figure 3A:
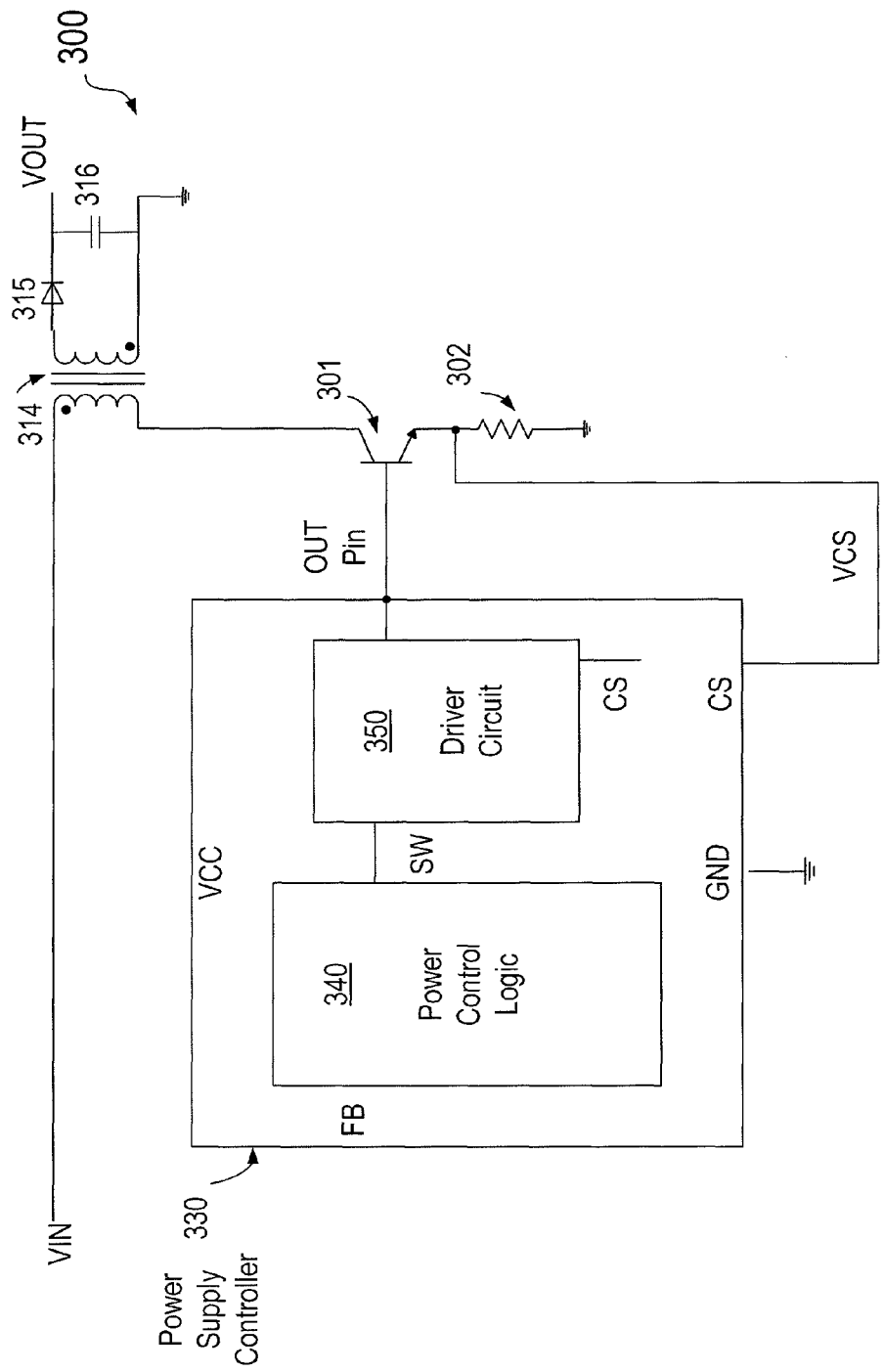
FIG. 3A is a circuit schematic/block diagram illustrating a switching mode power supply system according to an embodiment of the present invention.

FIG. 3A is schematic/block diagram of switching mode power supply system (SMPS) 300 according to an embodiment of the present invention. As shown, SMPS 300 includes a transformer 314 that has a primary winding and a secondary winding (not labeled explicitly). SMPS 300 also has a power transistor 301 coupled to the primary winding. Power transistor 301 is also coupled to a power supply controller 330, which is configured to issue a control signal at its OUT pin to power transistor 301. A voltage VCS across a resistor 302 is used to sense a current flowing through power transistor 301 and the primary winding. SMPS system 300 also has other standard SMPS components as shown in SMPS 100 of FIG. 1, such as auxiliary winding, feedback circuits, and rectifying circuits, etc., which are omitted in FIG. 3A to reduce the complexity of the drawing.

As shown in FIG. 3A, power supply controller 330 includes a power control logic 340, which, in some embodiments, may have standard control functions similar to conventional controllers such as controller 103 of FIG. 1. Depending on the embodiment, power control logic 340 can also include pulse frequency modulation (PFM) or pulse width modulation (PWM) control logic circuits. Power supply controller 330 also includes a driver circuit 350 which is configured to provide improvement in driving the power transistor according to embodiments of the present invention.

Figure 3B:
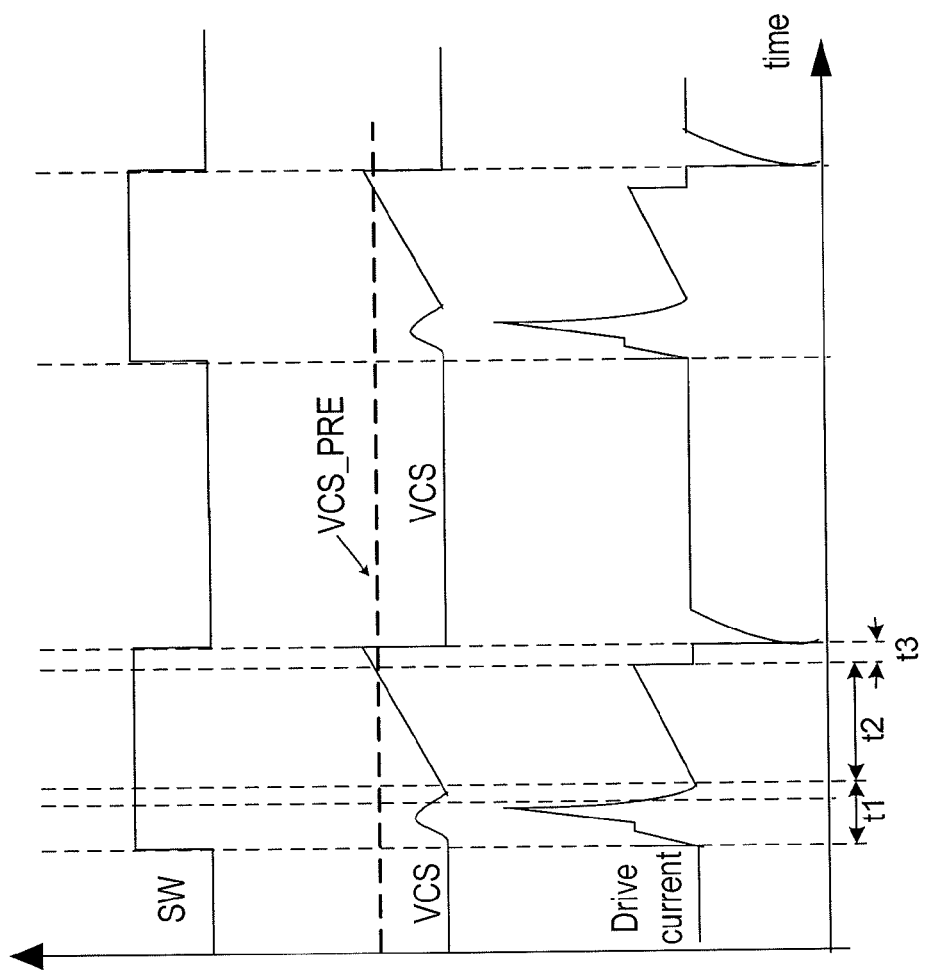
FIG. 3B is a timing diagram illustrating signal waveforms in the power supply controller of FIG. 3A according to an embodiment of the present invention.

Some features of the embodiment of FIG. 3A can be described using the waveform diagrams in FIG. 3B. For example, in FIG. 3B, waveform "SW" shows the power supply control signal pulse, similar to signal SW in FIG. 2, and waveform "Drive current" in FIG. 3B is the drive signal to a control terminal of the power transistor, corresponding to "Base current" in FIG. 2. Additionally, waveform "VCS" in FIG. 3B shows a voltage on the primary current sense resistor (302 in FIG. 3A), corresponding to primary current "Ip" in FIG. 2.

As shown by waveform "Drive current" in FIG. 3B, power supply controller 350 is configured to provide a drive current to a control terminal of a power transistor (e.g., the base terminal of power transistor 301) in three time intervals:

During a first time interval t1, a first drive current includes a current spike for turning on the power transistor in response to a start of the control signal pulse SW;

During a second time interval t2, a second drive current includes a ramping current having a magnitude substantially proportional to a magnitude of the primary current; and During a third time interval t3, current flow to the power transistor is at least partially turned off before the end of control signal pulse SW.

In some embodiment, a method for driving a bipolar power transistor includes applying driving signals in several stages. During a first time period (including times t1 and t2), the power transistor is turned on with an initial drive current, which can be started in response to a power supply control signal. An example is shown as the initial step in the "Drive current" waveform in FIG. 3B. As shown in the "VCS" waveform, which is the voltage on the current sense resistor and reflects the magnitude of the primary current Ip, a current spike is built up. Embodiments of the invention provide a method for increasing the power transistor drive current with a current related to this leading edge current spike on a current sense resistor during time t1. Then, during time t2, current flow in the power transistor is maintained with a ramping drive current. When it comes time to turn off the power transistor, during a second time period (shown as t3), the "Drive current" is turned off, but current flow in the power transistor continues to flow, in part due to the stored charges in the power transistor. This is shown as the rising VCS curve during time t3.

Figure 3C:
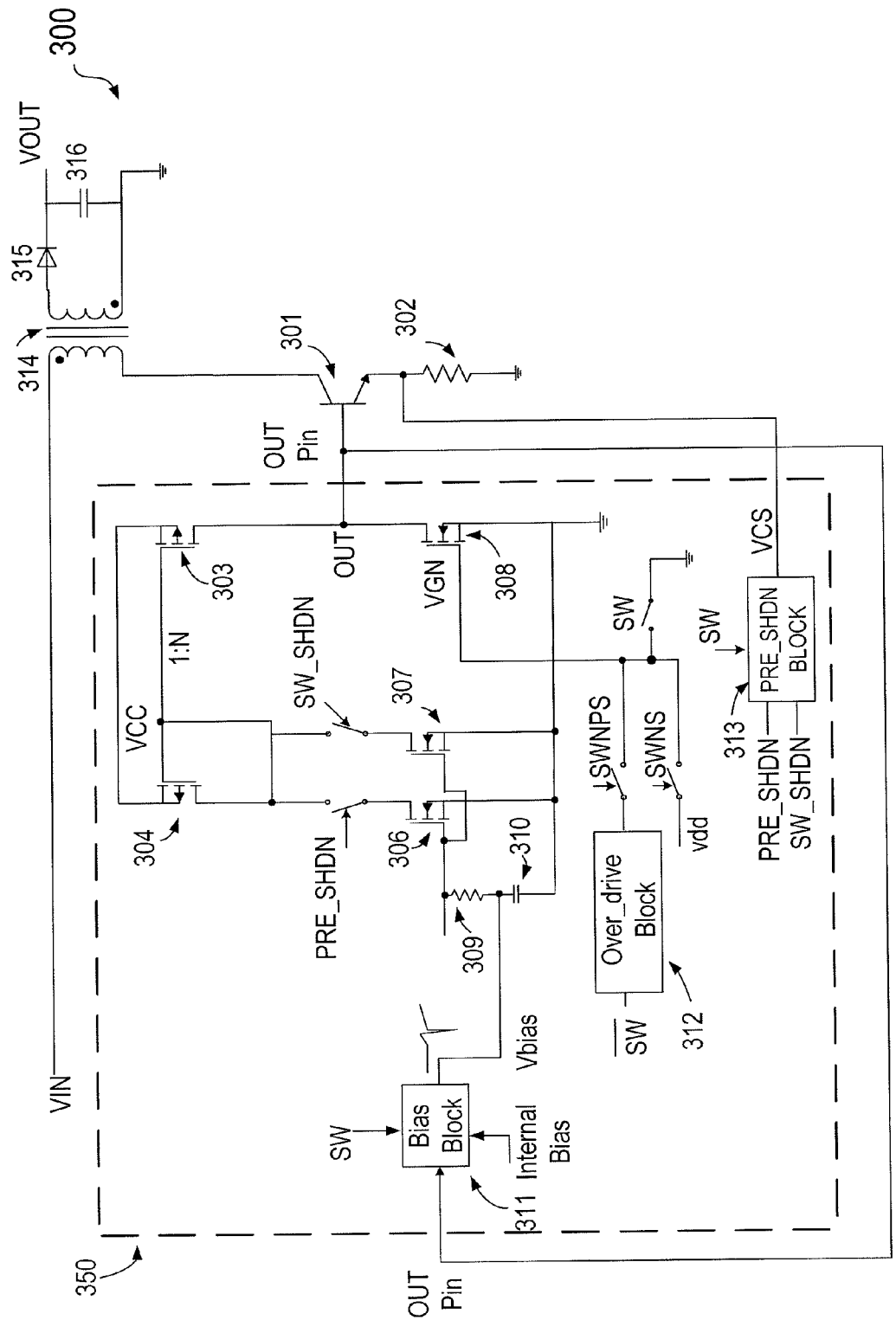
FIG. 3C is a circuit schematic/block diagram illustrating a switching mode power supply system including specific implementation of the driver circuit of FIG. 3A according to an embodiment of the present invention.

FIG. 3C is circuit schematic diagram of switching mode power supply system 300 showing a specific implementation of driver circuit 350 of FIG. 3A according to an embodiment of the present invention. In FIG. 3C, the controller block 330 of FIG. 3A has been omitted to simplify the drawings.

Driver circuit 350 in FIG. 3C, can be part of the power supply controller chip. Alternatively, it can be implemented in a separate integrated circuit chip. In an embodiment, driver current 350 is configured to receive a switch control signal SW from a control logic in the power supply controller and provide a power transistor control signal at an output node OUT, also marked as OUT pin in FIG. 3C. In this embodiment, driver circuit 350 has a PMOS transistor 303 and an NMOS transistor 308 coupled through the OUT node to power transistor 301. As described below, transistors 303 and 308 are used to speed up the switching speed of power transistor 301. In some embodiments, transistor 308 is used to speed up the discharge of the power transistor, and is referred to herein as the discharge transistor or the low-side transistor. Driver circuit 350 also includes several functions blocks, such as an internal bias block 311, an overdrive block 312, and a pre-shutdown block 313. The overall function of base drive circuit 350 and detailed operation of internal bias block 311, overdrive block 312, and pre-shutdown block 313 are described below, with reference to waveforms depicted in FIG. 3D, which is a timing diagram illustrating waveforms of various signals in the switching mode power supply system of FIG. 3C according to an embodiment of the present invention.

When switch control signal SW is high, internal bias block 311 provides the bias for the first overdrive current. As shown in FIG. 3C, internal bias block 311 provides the bias voltages to the gate terminals of NMOS transistors 306 and 307 for the first bias current. Control signals PRE_SHDN and SW_SHDN, which are provided by pre-shutdown block 313, are set at high levels. Then the first bias current is mirrored by PMOS 304 and 303 to generate the first over drive current.

Once power transistor 301 turns on, the OUT pin voltage begins to ramp up and is coupled to internal bias block 311 through a feedback path to form a combined bias voltage Vbias. As shown in the waveform diagrams in FIGS. 3B and 3D, a voltage spike in VCS is present on current sense resistor 302, when the power transistor 308 is turned on. In embodiments of the invention, the voltage spike in VCS is introduced to bias block 311 through the Out Pin and the feedback path. This voltage spike appears as a higher bias voltage Vbias, which is applied to NMOS transistor 306 and 307 and mirrored to PMOS transistor 303, thus providing a higher drive current spike to switch power transistor 301.

Figure 3D:
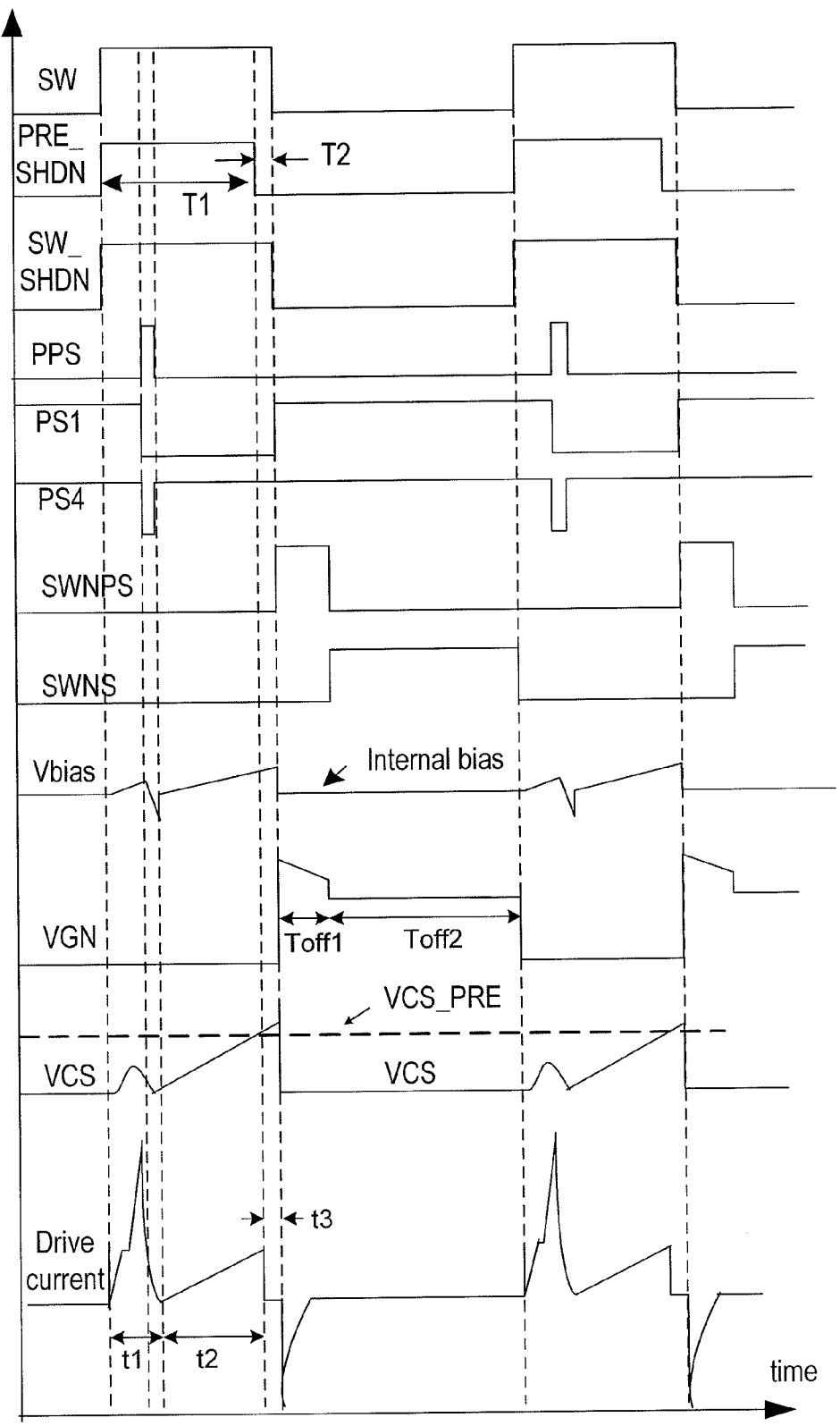
FIG. 3D is a timing diagram illustrating waveforms of various signals in the switching mode power supply system of FIG. 3C according to an embodiment of the present invention.

As shown in FIG. 3D, after a pre-determined time interval, as marked by time t1 associated with waveform "Drive current" in FIG. 3D, the combined bias voltage Vbias is pulled down to GND by a narrow pulse interval PPS, and the drive current will be down to a minimum level. Then, during time interval t2, bias voltage Vbias is supplied only by the OUT pin voltage, so the drive current increases with a slope proportional to the primary current.

When the current sense voltage VCS reaches a pre-shutdown level, VCS_PRE, the pre_shutdown block 313 provides control signal of PRE_SHDN, which cuts off the major drive current for a time interval, marked by T2 in FIG. 3D. The remaining forward drive current will also be cut off. Note in FIG. 3D, signal PRE_SHDN remains high in time period T1 which includes the two stages of drive current flow. After time period T2, discharge transistor (low-side transistor) 308 is turned on to speed up the discharge of the power transistor.

An embodiment of the invention provides a method for turning off a bipolar transistor, such as power transistor 301. The method includes coupling an MOS transistor to a base of the bipolar transistor, and biasing the MOS transistor is bias in two stages. During a first time period, a first voltage is applied to a gate of the MOS transistor to discharge the bipolar transistor. And during a second time period, a second voltage is applied to the gate of the MOS transistor. The first voltage is a higher voltage and overdrives the MOS transistor for fast discharge of the bipolar transistor. The second voltage is lower than the first voltage, but is sufficient to maintain a moderate Rdson.

In this embodiment, the over_drive block 312 provides an overdriven voltage VGN to the gate of the low-side transistor 308 in the drive circuit. As shown by the waveform "VGN" in FIG. 3D, during time period Toff1, low-side transistor 308 will be overdriven to turn on rapidly to provide a low resistance path to discharge the storage charges to speed up the turn off process of the power transistor. As shown in FIG. 3C, VGN is at GND, when the SW signal is high.

During time period Toff2, when the control signal SWNS becomes high level, the gate voltage of 308 will be set to Vdd, an internal power supply voltage, to ensure the enough gate voltage during the long off time when the switch control signal SW is low. As shown in FIG. 3C, the coupling between over_drive block 312 and discharge transistor 308 includes control signals SWNPS and SWNS, which are provided by Power Control Logic 340 in some embodiments. In a specific embodiment, the internal Vdd may be 5V, which is derived from a power controller chip supply voltage VCC, which may be more than 10V.

Embodiments of the present invention also provide a method for short circuit protection of current sense resistor in the primary side. As shown in FIG. 3C, when current sense resistor 302 is shorted or changed to a lower value, the power transistor is only turned on by the initial overdrive current. Virtually no further base drive current is generated due to the lower voltage on the current sense resistor, so the power transistor will turn on for a short period of time and then be cut off. Thus the primary current will not continue to increase beyond the capability to ensure the safety of the power transistor and the whole system.

Figure 4:
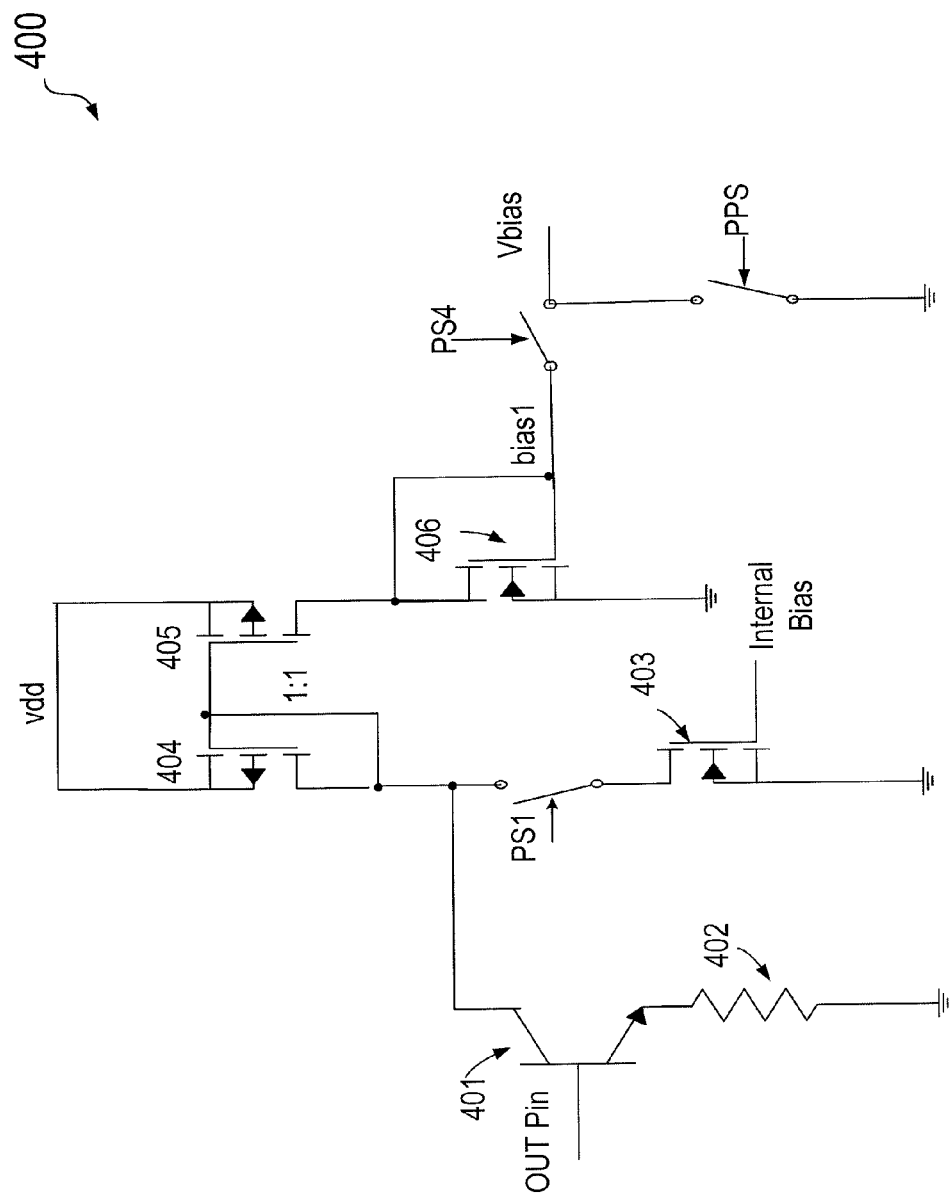
FIG. 4 is a circuit diagram illustrating a specific implementation of the bias block circuit of the switching mode power supply system of FIG. 3C according to an embodiment of the present invention.

FIG. 4 is a circuit diagram illustrating a specific implementation of bias block circuit 311 of the switching mode power supply system 300 of FIG. 3C according to an embodiment of the present invention. As shown in FIG. 4, bias block circuit 400 includes a bipolar transistor 401, a resistor 402, MOS transistors 403 and 406, and a current mirror circuit formed by transistors 404 and 405. Circuit 400 also includes three switches controlled by switch signals PS1, PS4, and PPS, respectively. In an embodiment, these switch signals are generated by control logic circuits in the power controller. Circuit block 400 also receives a bias signal "Internal Bias" and the "OUT Pin" signal, which is coupled to a control terminal of the power transistor as described above.

In an embodiment, bias block circuit 400 is configured to generate bias voltage Vbias, which can provide a higher over current and a ramping up drive current proportional to the current of the primary winding. When switch control signal SW is high, control signal of PS1 and PS4 will turn on the switch controlled by them respectively. The internal bias voltage in FIG. 4 provides the initial bias voltage. Then the first over-drive current will be generated, with PMOS transistor 405 supplies the overdrive current to the external power transistor because of the voltage spike on OUT Pin. As a result of the voltage spike, the OUT pin voltage begins to ramping up and is sent to the internal base terminal of 401. Then internal bias voltage bias2 and the OUT pin voltage turn on transistors 401 and 403, respectively. The increased current is reflected in he current of PMOS 405 will be increased to provide the higher over-drive current. As shown, circuit block provides the combined bias voltage Vbias.

As shown time interval t1 in FIG. 3D, after a pre-determined time interval, the combined bias voltage Vbias is pull down to GND by narrow pulse signal PPS, then the drive current will decrease to a minimum value. In FIG. 4, the switch controlled by control signal PS1 will be turned off, and the combined bias voltage Vbias will be only supplied by OUT pin voltage. Subsequently, during time interval t2 in FIG. 3D, the drive current will increase with a slope proportional to the primary winding current. In an embodiment, the selection of the pre-determined time interval for resetting combined bias voltage Vbias is intended to provide sufficient drive current to the power transistor, but without overly charging it, because excess storage charges tend to prolong the discharging time and limit the useful frequency range of the power supply.

The embodiments describe above can also provide protection functions against certain malfunctions of the power supply control circuit. For example, in the event that the current sense resistor is shorted or changed to a lower value, the OUT pin voltage is drop down also and can not be added for the combined voltage. So the bias block circuit only provides a initial bias voltage "Internal bias" to generate the initial overdrive current, virtually no further base drive current is generated, so the power transistor will turn on for only a short period of time and then be cut off. The primary current will not continue to increase beyond its capability to ensure the safety of the power transistor and the whole system.

Figure 5A:
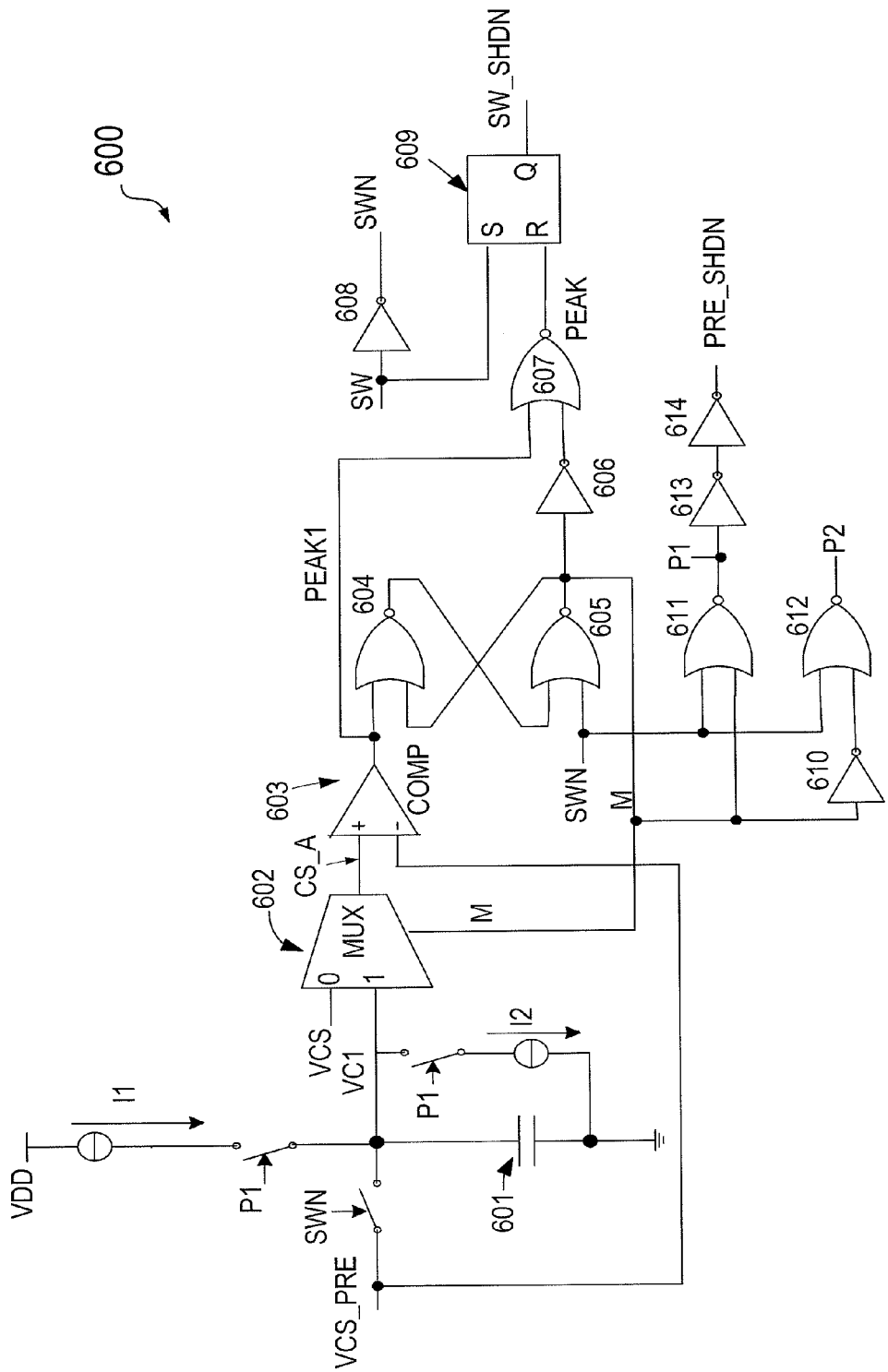
FIG. 5A is a circuit diagram illustrating a specific implementation of the pre-shutdown circuit of the switching mode power supply system of FIG. 3C according to an embodiment of the present invention.
Figure 5B:
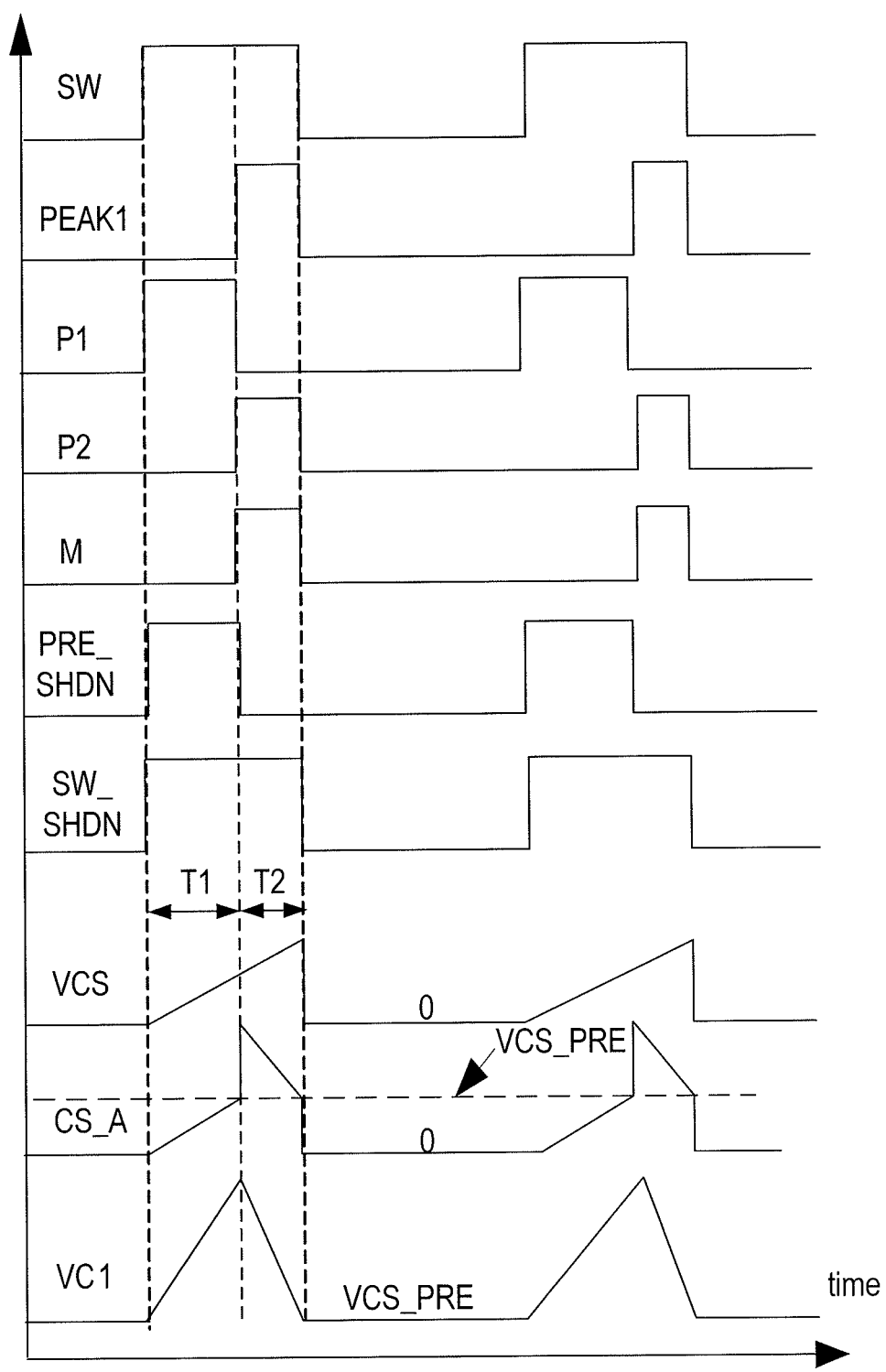
FIG. 5B is a timing diagram illustrating waveforms of various signals in the pre-shutdown circuit of FIG. 5A according to an embodiment of the present invention.

FIG. 5A is a circuit diagram illustrating a specific implementation of the pre-shutdown 313 circuit of the switching mode power supply system 300 of FIG. 3C according to an embodiment of the present invention. FIG. 5B is a timing diagram illustrating waveforms of various signals in the pre-shutdown circuit 600 of FIG. 5A according to an embodiment of the present invention. As shown in FIG. 5A, pre-shutdown block 600 includes a capacitor 601, a multiplexer circuit 602, a comparator 603, a latch circuit formed with gates 604 and 605, and additional logic gates. Current sources I1 and I2 and switches SWN, P1, and P2 are configured for charging and discharging of capacitor 601.

As shown in FIG. 5B, when switch control signal SW is high, power transistor 308 is turned on, and the current sense voltage VCS begins to increase. The switch control signal P1 is high and the capacitor 601 is being charged with the initial value of a fixed voltage VCS_PRE. The positive terminal of comparator 603 is connected with the output terminal of the 2 to 1 multiplexer 602, and the negative terminal of comparator 603 is connected to the internal pre-shutdown level VCS_PRE. One input terminal of multiplexer 602 is connected with VCS, the current sense voltage associated with the primary current. The other terminal of the 2 to 1 multiplexer 602 is connected with capacitor 601 to received a voltage VC1. The enable signal "M" of the multiplexer 602 will select which input terminal is sent to the input of the comparator 603.

In FIG. 3D, the waveform for "PRE_SHDN" includes two time periods, T1 and T2. During T1, a drive current is provided to the power transistor, as shown during t1 and t2 of the "Drive current" waveform. During time period T2, the drive current is cut off. The ratio of T1 to T2 is related to the ratio of constant current sources 1 and 2 in FIG. 5A. For example, in a specific embodiment, I2=4*I1, and therefore, T2 is 25% of T1. In an embodiment, the duration of T2 is selected according to a charge storage time of power transistor 301 in FIG. 3C.

FIG. 5B also shows the waveform for "PRE_SHDN" including two time periods, T1 and T2. As shown in FIG. 5B, when current sense voltage VCS or CS_A reaches to the internal pre-shutdown level VCS_PRE, the output of the comparator 603 will change to a high level, then a switch control signal P2 is high to discharge the capacitor 601. The enable signal "M" of multiplexer 602 sets the capacitor voltage VC1 connected to positive input terminal of the comparator 603. When VC1 dropped to pre-shutdown level VCS_PRE, the switch control signal SW is turned off, and the enable signal "M" of multiplexer 602 causes the current sense value VCS to be connected to positive input terminal of the comparator 603 again. The capacitor voltage VC1 will be reset with the fixed voltage of VCS_PRE by control signal SWN.

In this embodiment, T2 is the duration of pre-shutdown control signal P2, and determines the time for cut off the major base drive current. By setting the ratio of charging current I1 and discharging current I2, time T2 can be selected, as described above.

Figure 6:
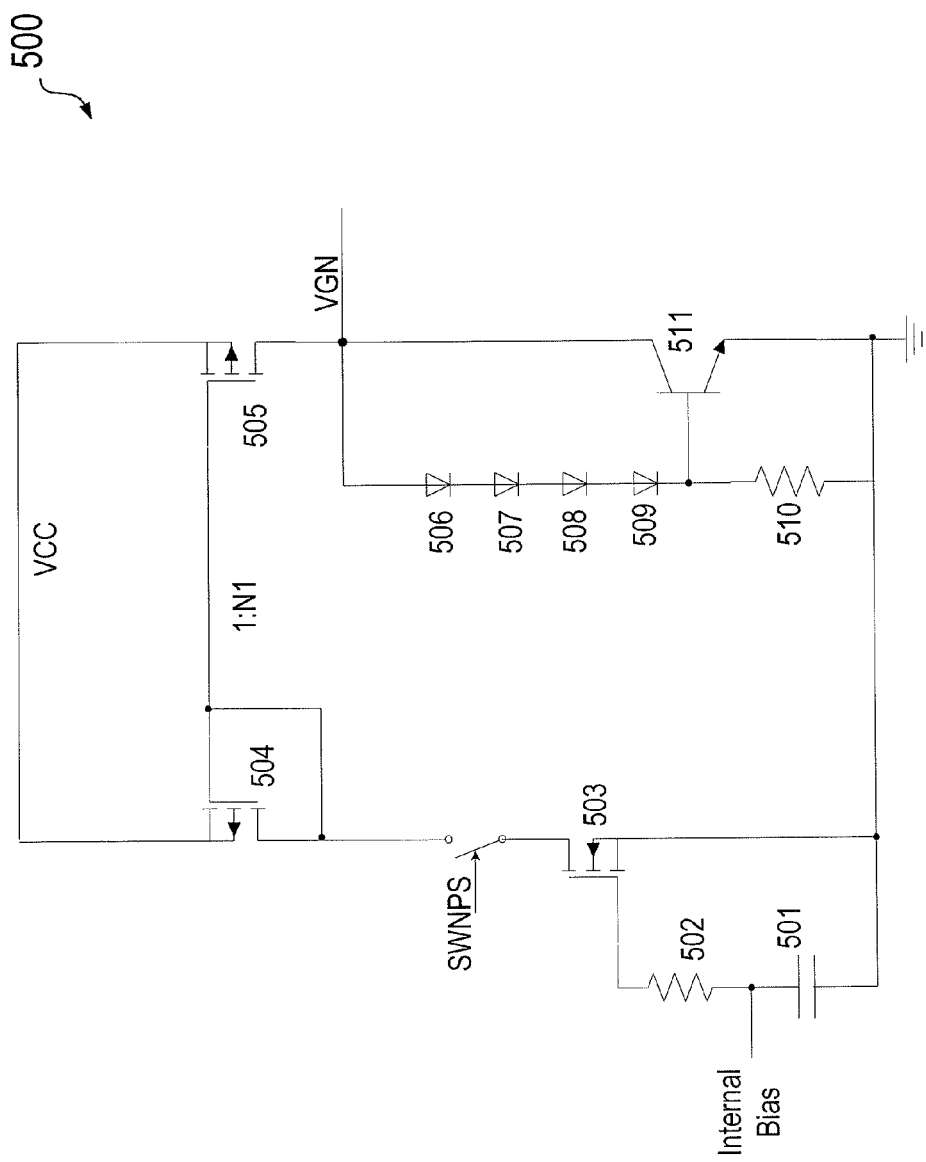
FIG. 6 is a circuit diagram illustrating a specific implementation of the overdrive block circuit the switching mode power supply system of FIG. 3C according to an embodiment of the present invention.

FIG. 6 is a circuit diagram illustrating a specific implementation of the overdrive block circuit 312 the switching mode power supply system of FIG. 3C according to an embodiment of the present invention, In an embodiment, overdrive block 500 provides an overdrive signal VGN to the discharge transistor or low-side transistor 308. As shown, overdrive circuit 500 includes a current source which, in this embodiment, is configured as a 1:N1 current mirror circuit formed with MOS transistors 504 and 505, where the current ratio N1 can be selected depending on the embodiment. Overdrive circuit 500 has a first circuit that includes MOS transistor 503, resistor 502, and capacitor 501. The first circuit is coupled to the current mirror through a switch controlled by signal SWNPS. The first circuit also receives a bias signal labeled Internal Bias. Overdrive circuit 500 also has a second circuit that includes a bipolar transistor 511, a resistor 510, and one or more diode devices 506-509 connected in series.

When the power controller determines that the power transistor needs to be turned off, control signal SWNPS is used to turn on the switch coupled to the current mirror to generate current in NMOS 503. The current is then mirrored to PMOS 505. As shown in FIG. 5, output signal VGN is set by the forward voltages of the series diodes 506-509 and a forward base-emitter diode of NPN transistor 511. As shown in FIG. 3, the VGN signal is connected to the gate of low-side transistor 308 of base drive circuit 350 when SWNPS is high.

In some embodiments, e.g., as shown in FIG. 6, the current mirror is coupled to power supply VCC of the power supply controller, which is higher than the internal power supply Vdd inside the power supply controller. As shown in FIGS. 3B and 6, the gate of low-side transistor 308 can be coupled to either VCC or Vdd, depending on the switches controlled by signals SWNS and SWNPS. For example, in some embodiments, VCC can be more than 10V, whereas Vdd is an internal bias voltage derive from VCC and may be 5V. Of course, different VCC and Vdd can be selected for different applications. In some embodiments, with overdrive block 500, VGN can be larger than the internal power supply Vdd, so low-side transistor 308 is overdriven in the first stage of turning off the power transistor, as shown in FIG. 3D.

As shown in FIGS. 3C and 3D, when the power supply controller turns control signal SWNS to a high level, the gate voltage of 308 is set to internal power supply voltage Vdd, to maintain the gate voltage during the power transistor 301 off time when the switch control signal SW is low.

As described above with reference to FIG. 3D, when switch control signal SW is high, the power transistor is turned on by an initial overdrive current. Then the voltage on the primary current sense resistor VCS is sent to internal bias block 311, which with an internal bias voltage outputs a higher combined bias voltage Vbias to provide a higher overdrive current.

After a pre-determined time interval, the combined bias voltage Vbias will be pull down to GND by a narrow pulse control signal PPS and the drive current decreases to a minimum value. Then the bias voltage Vbias will be only supplied by the OUT pin voltage, so the drive current increases with a slope proportional to the primary winding current. When VCS voltage reaches to its internal pre-shutdown voltage VCS_PRE, the major base drive current will be cut off for a time interval that is a fraction of the power switch turn on time. The remaining forward drive current will also be cut off and low-side transistor 308 will be turned on.

As described above, signal SWNPS controls the gate overdrive voltage circuit to provide a overdriven voltage VGN, which is applied to the gate of the low-side transistor of the base drive circuit. In some embodiment, VGN can be larger than the internal power supply Vdd, so the low-side transistor 308 is overdriven in the first stage to turn off the power transistor. When the control signal SWNS becomes high level, the gate voltage of the low-side transistor 308 will be Vdd, the internal power supply voltage to ensure the enough gate voltage during the power transistor off time when the switch control signal SW is low.

While the preferred embodiments of the invention have been illustrated and described, it will be clear that the invention is not limited to these embodiments only. Numerous modifications, changes, variations, substitutions and equivalents will be apparent to those skilled in the art without departing from the spirit and scope of the invention.

What is claimed is:

1. A power supply controller for providing a drive current to a control terminal of a power transistor in three time intervals, the controller comprising control circuits configured to:
    during a first time interval, provide a first drive current that includes a current spike for turning on the power transistor in response to a start of the control signal pulse;
    during a second time interval, provide a second drive current that includes a ramping current substantially proportional to a magnitude of a current through the power transistor; and
    during a third time interval, at least partially turn off current flow to the power transistor before an end of the control signal pulse.

2. The power supply controller of claim 1, further comprising a first feedback circuit for providing the current spike in response to a current spike in a signal associated with a current flow in the power transistor.

3. The power supply controller of claim 1, further comprising a bias circuit configured to:
    in the first time interval, provide a drive current in response to an internal bias voltage and a signal at control terminal of the power transistor; and
    in the second time interval, provide the ramping drive current in response to a signal at the control terminal of the power transistor, but independent of the internal bias voltage.

4. The power supply controller of claim 3, wherein the bias circuit is configured to reset the drive current to a low value before the start of the second time interval.

5. The power supply controller of claim 1, further comprising a pre-shutdown circuit configured for receiving the power control signal pulse and turning off at least part of the drive current when the current through the power transistor reaches a pre-determined voltage in the third time interval.

6. The power supply controller of claim 5, wherein the pre-shutdown circuit comprises:
    first and second constant current sources;
    a capacitor coupled to the first and second constant current sources and configured to be charged by the first constant current source and discharged by the second constant current;
    a multiplexer for selecting one of two input terminals in response to an enable signal, wherein
    a first input terminal is coupled to the capacitor; and
    a second input terminal is coupled to a current sense voltage representing a current through the power transistor;
    a comparator with a first input terminal coupled to the output terminal of multiplexer and a second input terminal coupled to the pre-determined voltage; and
    a logic circuit for receiving the power control signal pulse and providing one or more timing signals.

7. The power supply controller of claim 6, wherein a duration of the third time interval is related to relative current magnitude of the first and the second constant current sources.

8. The power supply controller of claim 6, wherein a duration of the third time interval is related to a charge storage time of the power transistor.

9. The power supply controller of claim 6, further comprising:
    a first switch for coupling the capacitor with the internal pre-shutdown voltage for charging the capacitor;
    a second switch coupling the capacitor with the first constant current source for charging the capacitor; and
    a third switch for coupling the capacitor with the second constant current source for discharging the capacitor.

10. The power supply controller of claim 1, further comprising a discharging circuit that includes:
    an MOS transistor coupled to a control terminal of the power transistor; and
    a control circuit configured to:
    during a first time period, applying a first voltage to a gate of the MOS transistor to discharge the power transistor; and
    during a second time period, apply a second voltage to the gate of the MOS transistor, the second voltage being lower than the first voltage.

11. A method for driving a bipolar power transistor, comprising:
    during a first time period:
    turning on the power transistor with an initial drive current;
    increasing the drive current with a current related to a leading edge current spike on a current sense resistor; and
    maintaining current flow in the power transistor with a ramping drive current; and
    during a second time period:
    turning off the drive current while allowing current flow in the power transistor to continue.

12. The method of claim 11, further comprising resetting the drive current to a low value before the start of the ramping drive current.

13. The method of claim 11, further comprising deriving the ramping current using a feedback signal from a control terminal of the power transistor.

14. The method of claim 11, further comprising using first and second current sources to determine a duration of the first time period and a duration of the second time period.

15. A switching mode power supply (SMPS), comprising:
    a primary winding;
    a power transistor coupled to the primary winding;
    an auxiliary winding for providing a feedback signal, the feedback signal being related to a current flow through the primary winding; and
    a power supply controller for providing a drive current to a control terminal of a power transistor in three time intervals, the controller including circuits configured to:
    during a first time interval, provide a first drive current that includes a current spike for turning on the power transistor in response to a start of the control signal pulse;
    during a second time interval, provide a second drive current that includes a ramping current substantially proportional to a magnitude of a current through the power transistor; and
    during a third time interval, at least partially turn off current flow to the power transistor before an end of the control signal pulse.

16. The switching mode power supply of claim 15, wherein the power supply controller further comprises a bias circuit configured to:

in the first time interval, provide a drive current in response to an internal bias voltage and a signal at control terminal of the power transistor; and in the second time interval, provide the ramping drive current in response to a signal at the control terminal of the power transistor, but independent of the internal bias voltage.

17. The switching mode power supply of claim 15, wherein the power supply controller further comprises a pre-shutdown circuit configured for receiving the power control signal pulse and turning off at least part of the drive current when the current through the power transistor reaches a pre-determined voltage in the third time interval.

18. The switching mode power supply of claim 15, wherein a duration of the third time interval is related to relative current magnitude of a first and a second constant current sources.

19. The power supply controller of claim 15, wherein a duration of the third time interval is related to a charge storage time of the power transistor.

20. The switching mode power supply of claim 15, wherein the power supply controller further comprises a discharging circuit that includes:

an MOS transistor coupled to a control terminal of the power transistor; and a control circuit configured to:

during a first time period, applying a first voltage to a gate of the MOS transistor to discharge the power transistor; and during a second time period, apply a second voltage to the gate of the MOS transistor, the second voltage being lower than the first voltage.

* * * * *